(12) United States Patent
Lanzillo et al.

(10) Patent No.: US 12,550,719 B2
(45) Date of Patent: Feb. 10, 2026

(54) VTFET CIRCUIT WITH OPTIMIZED OUTPUT

(71) Applicant: International Business Machines Corporation, Armonk, NY (US)

(72) Inventors: Nicholas Anthony Lanzillo, Wynantskill, NY (US); Brent A. Anderson, Jericho, VT (US); Lawrence A. Clevenger, Saratoga Springs, NY (US); Ruilong Xie, Niskayuna, NY (US); Albert M. Chu, Nashua, NH (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 17/945,498

(22) Filed: Sep. 15, 2022

(65) Prior Publication Data

US 2024/0096794 A1    Mar. 21, 2024

(51) Int. Cl.
*H01L 23/528* (2006.01)
*H01L 21/768* (2006.01)
*H01L 23/522* (2006.01)
*H10D 30/01* (2025.01)
*H10D 30/63* (2025.01)

(52) U.S. Cl.
CPC .... *H01L 23/5283* (2013.01); *H01L 21/76807* (2013.01); *H01L 21/76877* (2013.01); *H01L 23/5226* (2013.01); *H01L 23/5228* (2013.01); *H10D 30/025* (2025.01); *H10D 30/63* (2025.01)

(58) Field of Classification Search
CPC ............. H10D 62/127; H10D 362/151; H10D 64/252; H10D 84/85; H10D 84/0186; H10D 84/038; H10D 89/10; H10D 84/0195; H10D 30/025; H10D 30/0291; H10D 30/0318; H10D 30/63; H10D 30/66; H10D 30/6728; H10D 30/689; H10D 30/693; H01L 23/5283; H01L 21/76807; H01L 21/76877; H01L 23/5116; H01L 23/5228; H01L 21/76897; H01L 23/5286; H01L 21/76895
See application file for complete search history.

(56) References Cited

U.S. PATENT DOCUMENTS

| | | | |
|---|---|---|---|
| 6,836,106 B1 * | 12/2004 | Brelsford | G11C 29/56 324/762.02 |
| 9,613,861 B2 | 4/2017 | Anderson et al. | |
| 9,680,473 B1 | 6/2017 | Anderson et al. | |
| 9,934,977 B1 | 4/2018 | Adusumilli et al. | |

(Continued)

FOREIGN PATENT DOCUMENTS

EP    4588101 A1    7/2025

OTHER PUBLICATIONS

International Search Report, International Application No. PCT/IB2023/058758, Nov. 27, 2023, 8 pgs.

*Primary Examiner* — Galina G Yushina
(74) *Attorney, Agent, or Firm* — Kimberly Zillig (57) ABSTRACT

A semiconductor device includes: a first via level forming a bottom jumper configured to provide an output; a first set of two or more first metallization tracks overlying the first via level; a second via level forming a first top jumper overlying the first set of two or more first metallization tracks; and a second metallization track overlying the second via level.

12 Claims, 10 Drawing Sheets

(56) References Cited

U.S. PATENT DOCUMENTS

| | | |
|---|---|---|
| 10,074,570 B2 | 9/2018 | Anderson et al. |
| 10,256,186 B2 | 4/2019 | Bonilla et al. |
| 10,957,797 B2 | 3/2021 | Reznicek et al. |
| 11,251,179 B2 | 2/2022 | Hook et al. |
| 11,295,985 B2 | 4/2022 | Zhang et al. |
| 2004/0192037 A1* | 9/2004 | Barns ............... H01L 21/76879 257/E21.586 |
| 2007/0249163 A1* | 10/2007 | Oikawa ............... H10D 30/668 257/E29.022 |
| 2018/0019207 A1 | 1/2018 | Peng et al. |
| 2018/0218106 A1* | 8/2018 | Delk ..................... G06F 30/394 |
| 2019/0244900 A1* | 8/2019 | Frederick, Jr. ...... H01L 23/5283 |
| 2019/0355830 A1 | 11/2019 | Balakreshnan et al. |
| 2020/0295134 A1 | 9/2020 | Do et al. |
| 2021/0327759 A1 | 10/2021 | Xie et al. |
| 2022/0102357 A1* | 3/2022 | Lee ..................... H10B 12/315 |
| 2023/0094036 A1 | 3/2023 | Park et al. |
| 2023/0223471 A1* | 7/2023 | Oota ................... H10D 64/256 257/330 |

\* cited by examiner

DEVICE & MOL FORMATION

FIG.3A

VO JUMPER ETCH

FIG.3B

METAL DEPOSITION

FIG.3C

SUBTRACTIVE LINE FORMATION

FIG.3D

NEXT-LEVEL DIELECTRIC FORMATION

FIG.3E

V1M2 LITHO/ETCH

VTFET CIRCUIT WITH OPTIMIZED OUTPUT

BACKGROUND

The exemplary embodiments described herein relate generally to semiconductor device fabrication methods and resulting structures and, more specifically, to fabrication methods and resulting semiconductor device structures such as vertical transport field effect transistors.

Semiconductor device chip architectures for logic circuits use lateral-transport field effect transistors (FETs), such as fin field effect transistors, or finFETs, which layer the transistors along a surface of a silicon wafer. The transistors are typically arranged and laid out on the wafer in a horizontal fashion. The problem in a horizontal layout is that transistor components occupy a considerable amount of surface area on the chip, and increasing the number of transistor components while minimizing the surface area means that transistor density increases. In existing processes, transistor density increases have been focused on reducing the sizes of the various components. However, the fundamental units of the transistor components (which include insulating elements between transistors) all still have to fit within a minimum area required for a functioning transistor to be laid out.

A vertical transport FET (VTFET), on the other hand, layers transistors perpendicular to the wafer and also directs current flow perpendicular to the wafer surface. This approach addresses scaling barriers by relaxing physical constraints on transistor gate length, spacer thickness, and contact size so that these features can each be optimized, either for performance or energy consumption. Layering the transistors perpendicular to the wafer allows them to be scaled on the Z axis instead of occupying increased amounts of wafer floor space. Thus, manufacturers are able to reduce the number of components required for a functional transistor (more specifically, the inter-transistor insulators can be eliminated from the design), which in turn allows the transistors to be placed closer together. Current naturally flows perpendicular to the supporting wafer in this arrangement, instead of the common horizontal current flow that is currently employed.

US Patent Application No. 2020/0295134 discusses a vertical field effect transistor (VFET) cell architecture in which a gate connection pattern is formed between four VFETs to connect gates. A gate contact structure is formed on the gate connection pattern, and a metal pattern is formed on the contact structure. The metal pattern may be connected to the gate contact structure through a via formed between the metal pattern and the gate contact structure. The arm of US Patent Application No. 2020/0295134 is to provide improved cell architectures which include square-shape top source/drain (S/D) contact structures for internal routing between the VFETs and super vias for a gate connection, whereby a cell architecture has reduced dimensions. However, there are no jumpers in any of the embodiments disclosed in US Patent Application No. 2020/0295134. In fact, all of the architectures described in US Patent Application No. 2020/0295134 lack jumpers above and below the metal patterns. This lack of a jumper is addressed by the present invention.

BRIEF SUMMARY

In one exemplary aspect, a semiconductor device comprises: a first via level forming a bottom jumper configured to provide an output; a first set of two or more first metallization tracks overlying the first via level; a second via level forming a first top jumper overlying the first set of two or more first metallization tracks; and a second metallization track overlying the second via level.

The first via level may be of a length that is unequal to a length of the second via level. The first set of two or more first metallization tracks may comprise three or more metallization tracks, and spacing between three or more of the three or more first metallization tracks may be unequal. The first set of two or more first metallization tracks may be formed by a subtractive process. The first via level, the second via level, and the second metallization tracks may be formed by a damascene process. The second via level may form a second top jumper overlying a second set of first metallization tracks. The second top jumper may be of a length that is different from a length of the first top jumper. The second top jumper may overlie one metallization track of the second set of first metallization tracks. In circuits employing such configurations of metallization tracks and jumpers, via resistance may be lowered due to the use of multiple V0/M1/V1 sequences arranged in parallel, which improves the overall efficiency and performance of the circuit.

In another exemplary aspect, a vertical transport field effect transistor comprises: a bottom jumper formed in a substrate; a first M1 track and a second M1 track each overlying the bottom jumper; a first top jumper overlying the first M1 track and the second M1 track; and a first M2 track overlying the first top jumper.

The vertical transport field effect transistor may further comprise a third M1 track overlying the bottom jumper, wherein the first M1 track, the second M1 track, and the third M1 track are unequally spaced. The vertical transport field effect transistor may further comprise a second top jumper overlying at least a third M1 track, wherein the first M2 track extends to and overlies the second top jumper. The first top jumper and the second top jumper may be of unequal lengths. The use of multiple jumpers and metallization tracks in parallel can dramatically reduce the output resistance of the vertical transport field effect transistor for larger cells (for example, by tens of ohms).

In another exemplary aspect, a method comprises: providing a substrate; forming a depression into the substrate; depositing a first metal into the depression and onto an upper surface of the substrate, such that the deposited first metal protrudes from the depression; patterning the deposited first metal; subtractively etching the first metal down to the upper surface of the substrate to form a first jumper in the depression and a first set of two or more first metallization tracks overlying the first jumper; depositing a dielectric material over the subtractively etched first metal; patterning the dielectric material; forming an opening in the dielectric material down to upper surfaces of the first set of two or more first metallization tracks; depositing a second metal in the opening in the dielectric material to form a second jumper in the opening, the second jumper extending across at least two of the two or more first metallization tracks; patterning the deposited second metal; and depositing a third metal onto the patterned deposited second metal to form a set of two or more second metallization tracks. At least one of the two or more second metallization tracks extends over a length of the second jumper.

The method may further comprise forming a device region on the substrate. Forming the opening in the dielectric material down to upper surfaces of the first set of two or more first metallization tracks may comprise using a reverse selective barrier process. Depositing the first metal into the depression and onto the upper surface of the substrate may comprise using a first damascene process. Depositing the second metal in the opening in the dielectric material to form the second jumper in the opening may comprise using a second damascene process. Depositing the third metal onto the patterned deposited second metal to form the set of two or more second metallization tracks may comprise using a third damascene process. In any of the foregoing embodiments, a pathway from the V0 jumper to the M2 metallization track can be made of the same metal with no interface.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described herein are directed to the placement of metal in wiring configurations and to the use of jumpers and jumper patterning to connect the wiring. The wiring comprises metallization lines, which are used in the fabrication of VTFETs in order to optimize circuit outputs. In the embodiments disclosed, jumper patterning to connect the wiring is enabled by semi-damascene processes, which are preferred over dual damascene processes, to facilitate the formation of vias under the metallization lines. "Wrong-way" V0 jumper patterning is enabled by these semi-damascene processes, and so the vias may be configured to extend outward in regions where there is not a metallization line above them. In particular, multiple adjacently-positioned metallization lines (M1 tracks) are strapped together by via jumpers from the top as well as from below. This is generally carried out for large VTFET circuits (for example, NAND or NOR logic circuits) that utilize backside power and that have unused M1 tracks in the cell. In these circuits, via resistance is lowered due to the use of multiple V0/M1/V1 sequences arranged in parallel, which improves the overall efficiency and performance of the circuit.

Figure 1:
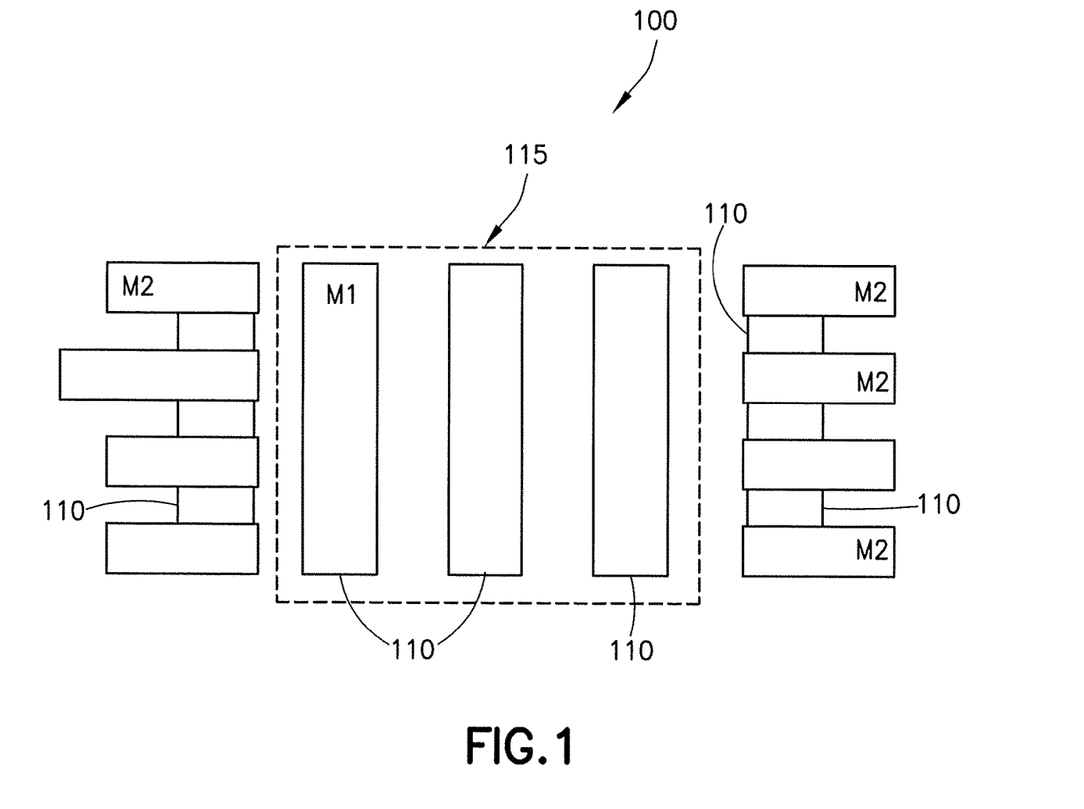
FIG. 1 is a schematic top view of a VTFET with unused M1 metallization tracks.

Referring now to the Figures, exemplary methods of VTFET circuits and their fabrication are shown. The size of a circuit footprint is generally characterized by the "cell gate pitch" or $C_{pp}$, which in the instant case is greater than 4 $C_{pp}$. Referring to FIG. 1, a VTFET with back-side power delivery is shown generally at 100 and is hereinafter referred to as "VTFET 100." VTFET 100 includes a plurality of M1 tracks 110, three of which are shown at 115 as being unused (not connected to metallizations M2) when power is moved to the backside.

Figure 2A:
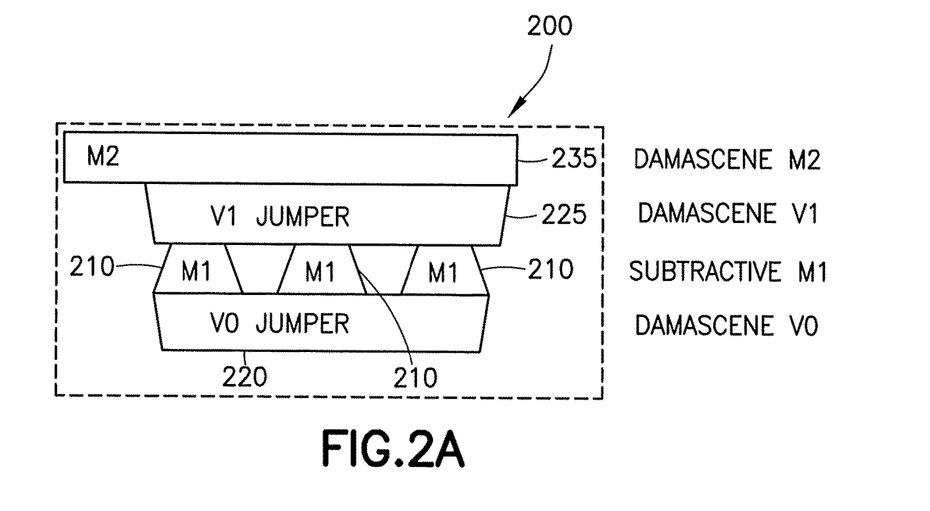
FIG. 2A is a schematic side view of one exemplary embodiment of a VTFET having a V1 jumper across M1 metallization tracks.
Figure 2B:
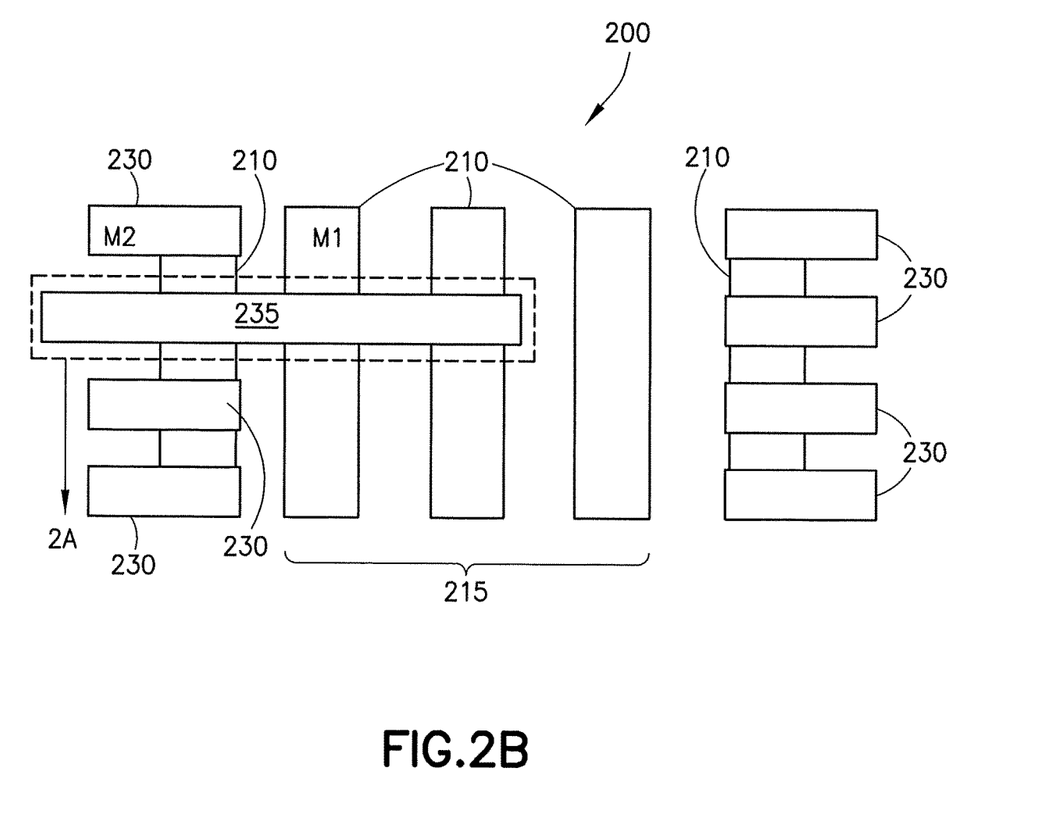
FIG. 2B is a schematic top view of the VTFET of FIG. 2A.

Referring now to FIGS. 2A and 2B, one exemplary embodiment of a VTFET with back-side power delivery is shown generally at 200 and is hereinafter referred to as "VTFET 200." VTFET 200 includes a via level V0 configured to output a signal, a first metallization layer M1, a V1 layer, and a second metallization layer M2. As shown in FIG. 2A, the first metallization layer M1 includes a plurality of M1 tracks 210 (three of which are shown as being unused at 215 in FIG. 2A) connected below by a V0 jumper 220 and connected above by a V1 jumper 225. As shown in FIG. 2B, five M1 tracks are shown at 210, and M2 tracks 230 may extend to one or more of the M1 tracks 210. An elongated M2 track 235 may extend over and completely cover an upper surface of the V1 jumper 225 (elongated M2 track 235 is shown as extending over three of the M1 tracks 210). The M1 tracks 210 may be formed using subtractive processes, whereas the V0 jumper 220, the V1 jumper 225, and the M2 tracks 230 (as well as the elongated M2 track 235) may be deposited using damascene processes.

Figure 3A:
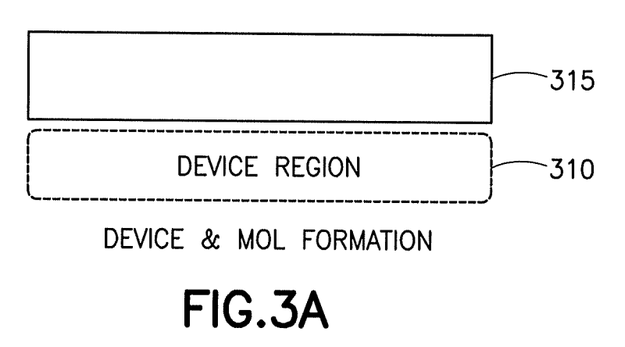
FIGS. 3A, 3B, 3C, 3D, 3E, and 3F are schematic side views of one exemplary embodiment of a process flow in which the VTFET of FIG. 2A may be fabricated.

Referring now to FIGS. 3A-3F, one exemplary embodiment of a process flow used for fabricating the VTFET 200 is shown generally 300 and is hereinafter referred to as "method 300." As shown at FIG. 3A, a middle-of-line (MOL) formation may be used to deposit one or more devices into a device region 310 on a substrate 315. The substrate 315 may be silicon, silicon oxide, silicon dioxide, or any other substrate material.

Figure 3B:
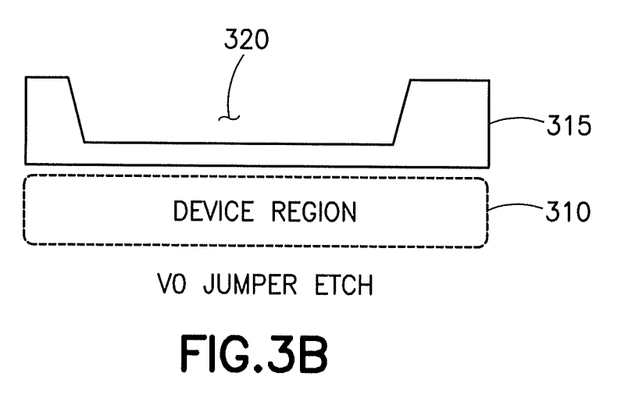

As shown at FIG. 3B, the substrate 315 may be etched using any suitable etching process (for example, reactive ion etching (RIE)) to form a trench or depression 320 in the substrate 315 (V0 jumper etch).

Figure 3C:
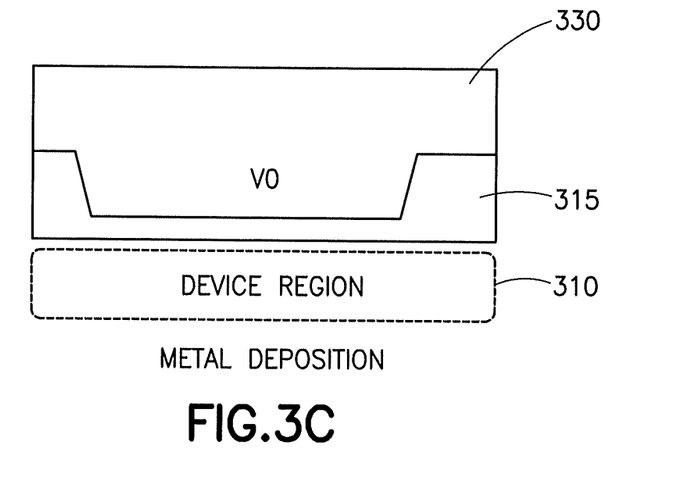

As shown at FIG. 3C, metallization is carried out in which the depression 320 may be overfilled with metal 330 using a damascene process (metal deposition and planarization) to form the V0 jumper 220. Planarization may be by chemical mechanical polish (CMP). Metals that may be used for the metal deposition include, but are not limited to, ruthenium, tungsten, cobalt, iridium, rhodium, molybdenum, niobium, and alloys and combinations of the foregoing.

Figure 3D:
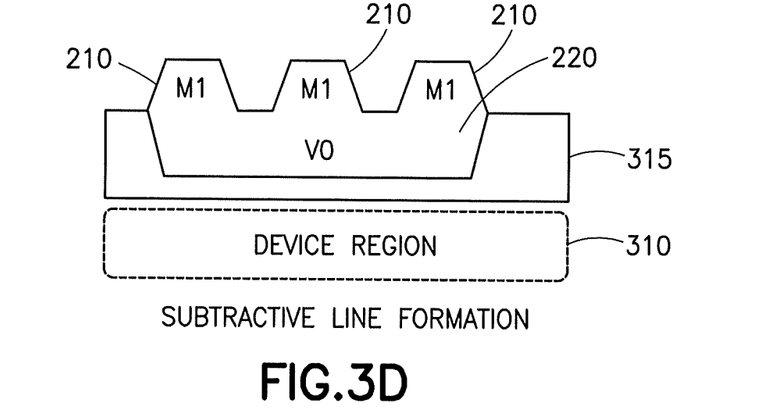

As shown in FIG. 3D, a subtractive process is used to form the metallization into the M1 tracks 210, thereby forming the M1 tracks 210 integral with the V0 jumper 220.

Figure 3E:
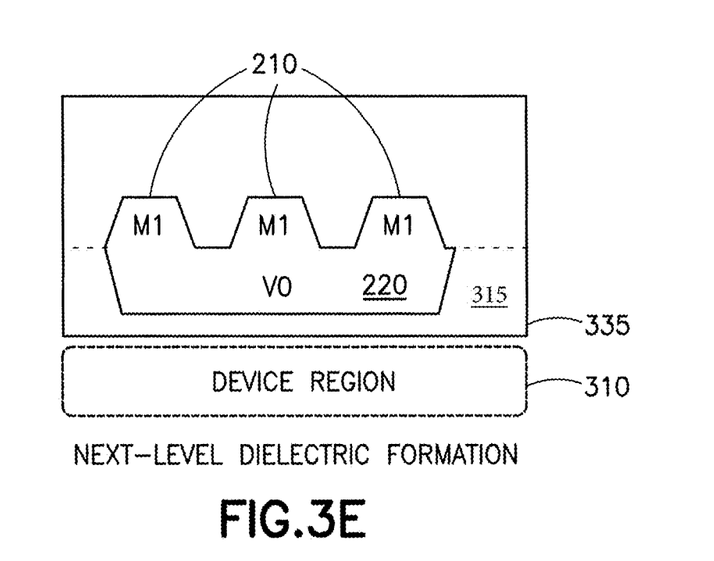

As shown in FIG. 3E, a dielectric layer 335 is deposited on the M1 tracks 210 and the V0 jumper 220.

Figure 3F:
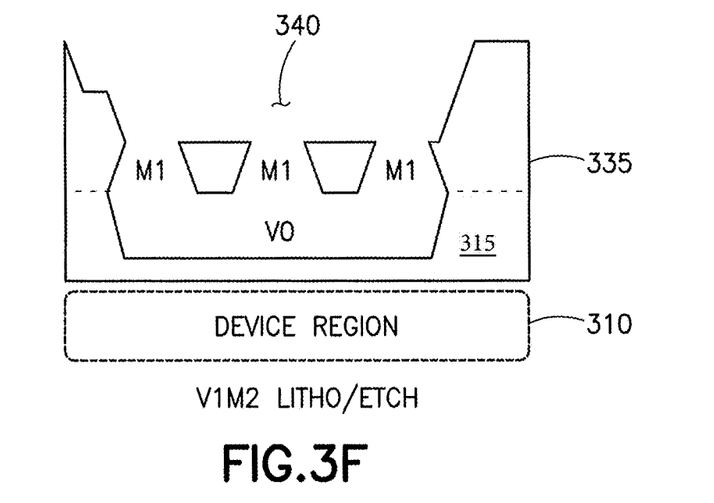

As shown in FIG. 3F, the dielectric layer 335 is etched using a lithography process to form an opening 340 in the dielectric layer 335 down to upper surfaces of the M1 tracks 210. Optionally, a reverse selective barrier (RSB) process can be used to remove the dielectric layer 335 down to the M1 tracks 210 (thereby enabling direct metal-to-metal contact). The opening 340 may then be filled with metal to form the V1 jumper 225. The metal used to form the V1 jumper 225 may be the same or different from the metals used for the V0 jumper 220 and the M1 tracks 210. A second metallization may be carried out using a damascene process to form the M2 track 230, as shown in FIG. 2A.

Figure 4A:
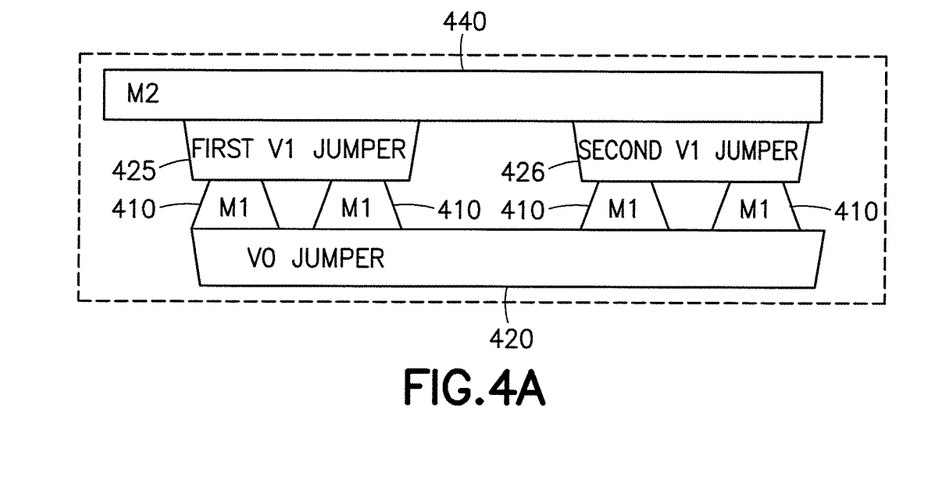
FIG. 4A is a schematic side view of one exemplary embodiment of a VTFET having a V1 jumper across M1 metallization tracks of unequal spacing.
Figure 4B:
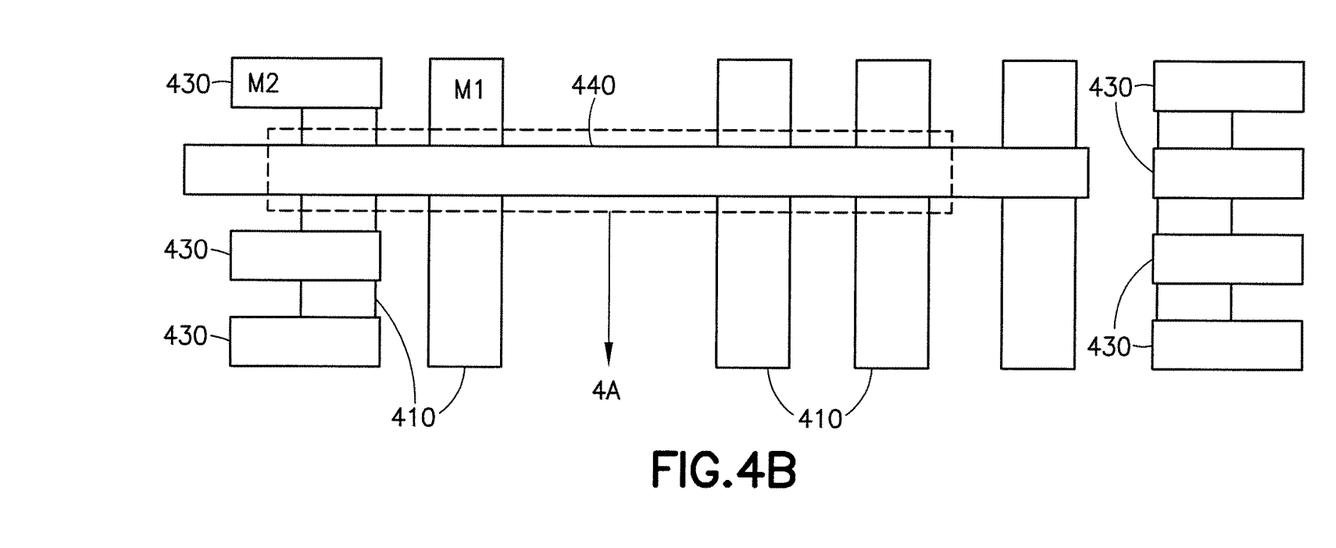
FIG. 4B is a schematic top view of the VTFET of FIG. 4A.

Referring now to FIGS. 4A and 4B, an alternate exemplary embodiment of a VTFET with back-side power delivery is shown generally at 400 and is hereinafter referred to as "VTFET 400." VTFET 400 is similar to VTFET 200 above and includes a plurality of M1 tracks 410 (four of which are shown in FIG. 4A) connected below by a V0 jumper 420. Two or more of the M1 tracks 410 are connected above by a first V1 jumper 425, and two or more of the M1 tracks 410 are also connected above by a second V1 jumper 426. The spacing of the M1 tracks 410 may be unequal. The lengths of each of the first V1 jumper 425 and the second V1 jumper 426 may be equal. M2 tracks 430 may extend to one or more of the M1 tracks 410. An elongated M2 track 440 may extend over and completely cover an upper surface of the first V1 jumper 425 and the second V1 jumper 426, thereby connecting the jumpers 425, 426. As with previous exemplary embodiments, the M1 tracks 410 may be deposited using subtractive processes, whereas the V0 jumper 420, the V1 jumpers 425, 426, and the M2 tracks 430 (as well as the elongated M2 track 440) may be deposited using damascene processes.

Figure 5A:
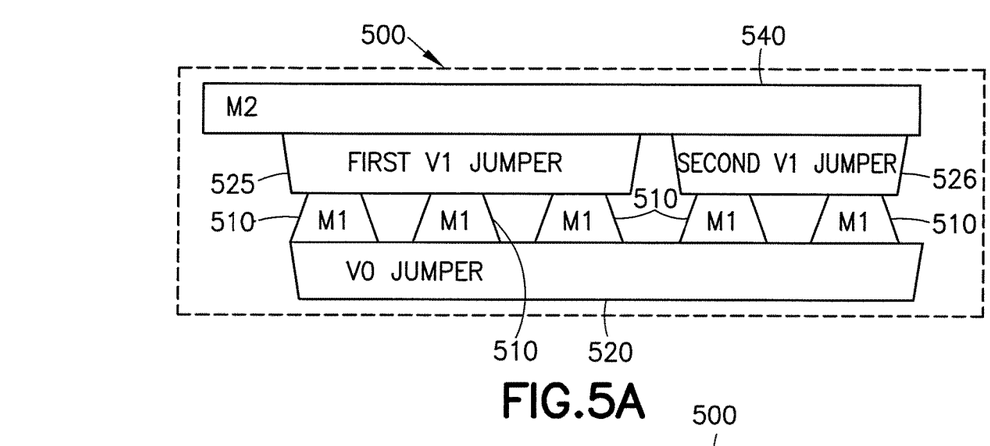
FIG. 5A is a schematic side view of one exemplary embodiment of a VTFET having multiple V1 jumpers of different sizes.
Figure 5B:
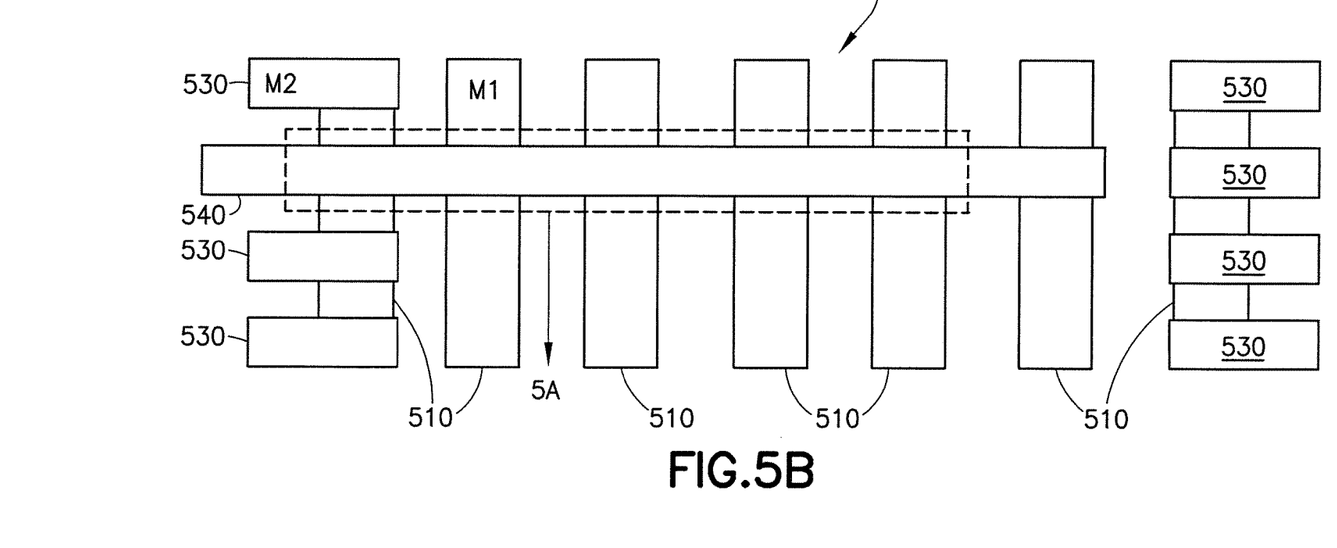
FIG. 5B is a schematic top view of the VTFET of FIG. 5A.

Referring now to FIGS. 5A and 5B, another alternate exemplary embodiment of a VTFET with back-side power delivery is shown generally at 500 and is hereinafter referred to as "VTFET 500." VTFET 500 is similar to VTFET 200 and VTFET 400 and includes a plurality of M1 tracks 510 (five of which are shown in FIG. 5A as being evenly spaced) connected below by a V0 jumper 520. Multiple V1 jumpers are incorporated. In particular, a first V1 jumper 525 having a first length L1 may be used to connect three M1 tracks 510, and a second V1 jumper 526 having a second length L2 may be used to connect two M1 tracks 510. L1 may be different from L2. The spacing of the M1 tracks 510 may be equal as shown, or it may be unequal. M2 tracks 530 may extend to one or more of the M1 tracks 510. An elongated M2 track 540 may extend over and completely cover an upper surface of the first V1 jumper 525 and the second V1 jumper 526, thereby connecting the jumpers 525, 526. As with previous exemplary embodiments, the M1 tracks 510 may be deposited using subtractive processes, whereas the V0 jumper 520, the V1 jumpers 525, 526, and the M2 tracks 530 (as well as the elongated M2 track 530) may be deposited using damascene processes.

Figure 6A:
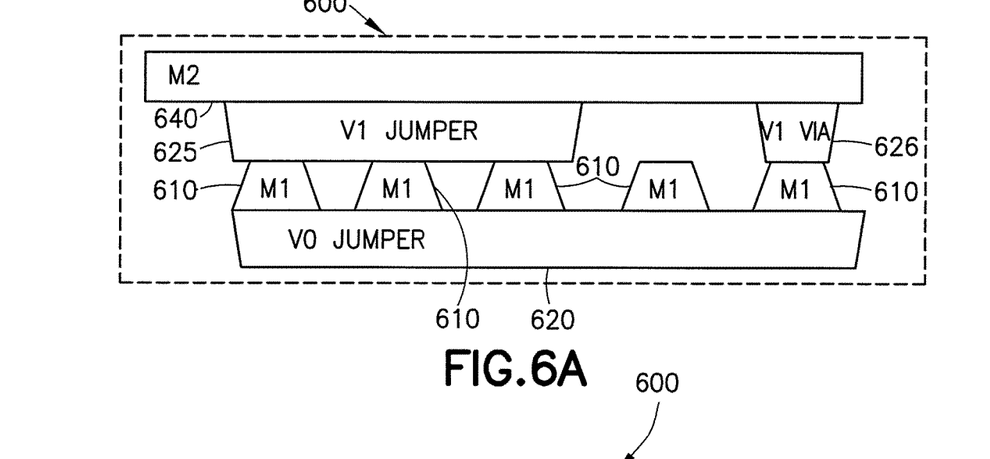
FIG. 6A is a schematic side view of one exemplary embodiment of a VTFET having a jumper and a via.
Figure 6B:
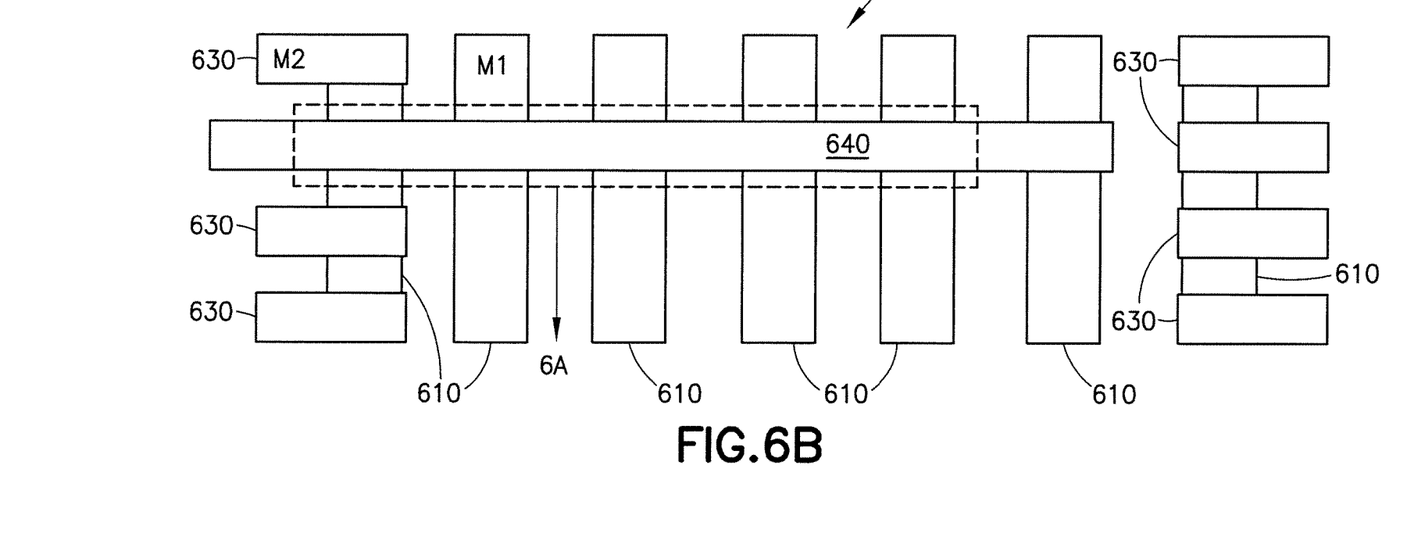
FIG. 6B is a schematic top view of the VTFET of FIG. 6A.

Referring now to FIGS. 6A and 6B, another alternate exemplary embodiment of a VTFET with back-side power delivery is shown generally at 600 and is hereinafter referred to as "VTFET 600." VTFET 600 is similar the VTFETs described above and includes a plurality of M1 tracks 610 (five of which are shown in FIG. 6A as being evenly spaced) connected below by a V0 jumper 620. M2 tracks 630 may extend to one or more of the M1 tracks 610. A V1 jumper 625 may be used to connect three M1 tracks 610, and a V1 via 626 may be used to connect an M1 track 610 to an elongated M2 track 640 extending over and completely covering an upper surface of the V1 jumper 625. As with previous exemplary embodiments, the M1 tracks 610 may be deposited using subtractive processes, whereas the V0 jumper 620, the V1 jumper 625, and the M2 tracks 630 (as well as the elongated M2 track 640) may be deposited using damascene processes.

Figure 7:
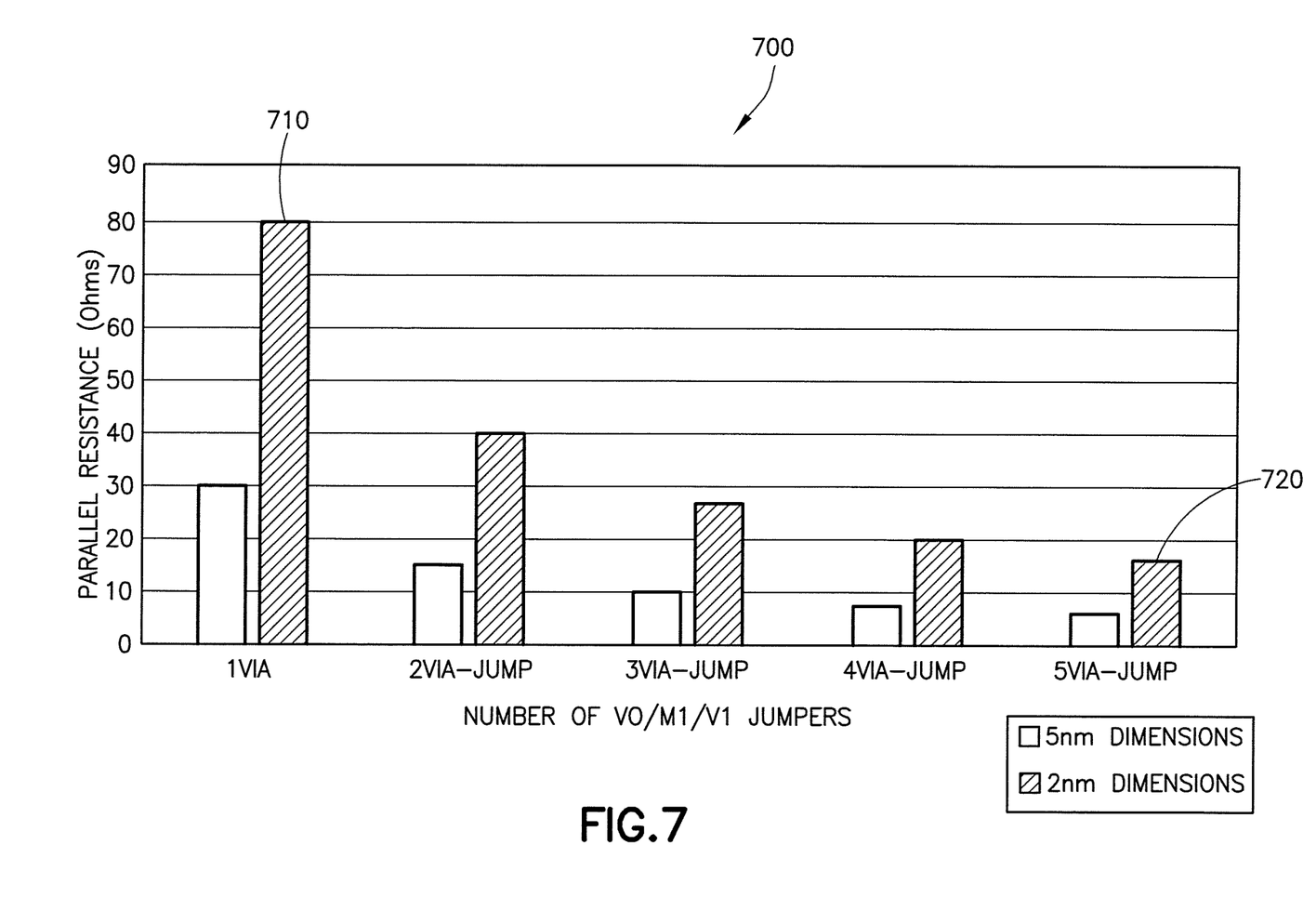
FIG. 7 is a graphical representation of parallel resistance of VTFETs as a function of a number of V0/M1/V1 objects.

Referring now to FIG. 7, a graph illustrating parallel resistance (in ohms) as functions of the numbers of vias and jumpers is shown generally at 700. Comparison is made for configurations in which the $C_{PP}$ is of the 5 nm or the 2 nm dimension. As can be seen, multiple V0/M1/V1 jumpers in parallel can reduce VTFET output resistance for larger cells. Particularly at 2 nm dimensions, output resistance can be reduced from about 80 ohms, as shown at 710, down to about 15 ohms, as shown at 720.

Figure 8:
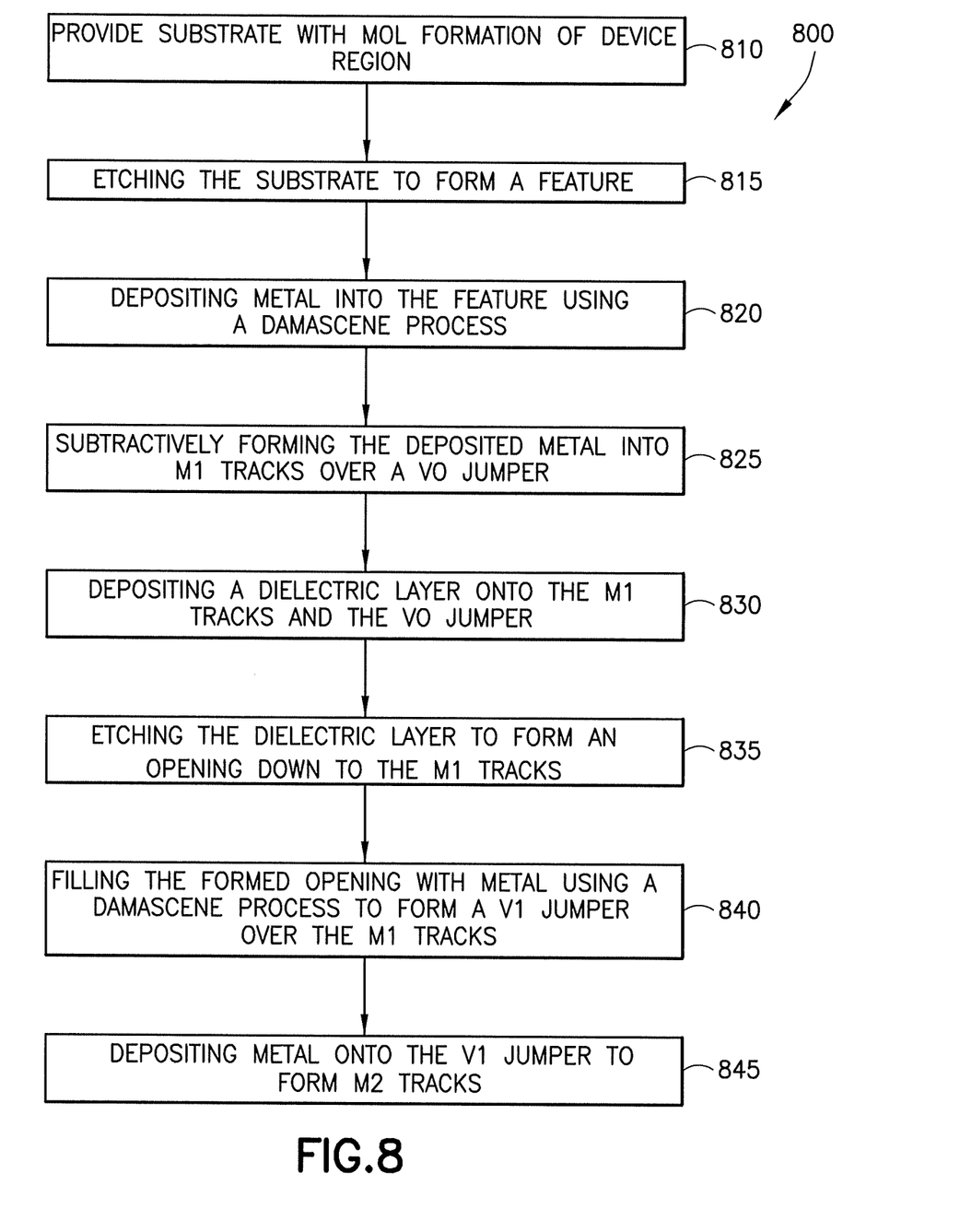
FIG. 8 is a flow chart of one exemplary method of forming a VTFET.

Referring to FIG. 8, one exemplary embodiment of a process flow for forming the VTFET 200 is shown generally at 800 and is hereinafter referred to as "method 800." In an initial step of the method 800, a substrate is provided with an MOL formation of a device region, as indicated at block 810. At block 815, the substrate is etched to form a depression or trench for the subsequent deposition of metal. At block 820, a first metal is deposited into the depression or trench and so as to protrude above the depression or trench using a damascene process to form the V0 jumper 220. Patterning is carried out as necessary. As indicated at block 825, a subtractive process is used to form M1 tracks over the V0 jumper. At block 830, a dielectric layer is deposited onto and over the formed M1 tracks and the V0 jumper. Again, patterning is carried out as necessary. At block 835, the dielectric layer is etched to form an opening down to an upper surface of the M1 tracks. As indicated at block 840, the opening down to the M1 tracks is metallized using a damascene process to deposit a second metal to form the V1 jumper over the M1 tracks. As indicated at block 845, a damascene process is used to deposit a third metal onto the V1 jumper to form M2 tracks.

In one aspect, a semiconductor device comprises: a first via level forming a bottom jumper configured to provide an output; a first set of two or more first metallization tracks overlying the first via level; a second via level forming a first top jumper overlying the first set of two or more first metallization tracks; and a second metallization track overlying the second via level.

The first via level may be of a length that is unequal to a length of the second via level. The first set of two or more first metallization tracks may comprise three or more metallization tracks, and spacing between three or more of the three or more first metallization tracks may be unequal. The first set of two or more first metallization tracks may be formed by a subtractive process. The first via level, the second via level, and the second metallization tracks may be formed by a damascene process. The second via level may form a second top jumper overlying a second set of first metallization tracks. The second top jumper may be of a length that is different from a length of the first top jumper. The second top jumper may overlie one metallization track of the second set of first metallization tracks.

In another aspect, a vertical transport field effect transistor comprises: a bottom jumper formed in a substrate; a first M1 track and a second M1 track each overlying the bottom jumper; a first top jumper overlying the first M1 track and the second M1 track; and a first M2 track overlying the first top jumper.

The vertical transport field effect transistor may further comprise a third M1 track overlying the bottom jumper, wherein the first M1 track, the second M1 track, and the third M1 track are unequally spaced. The vertical transport field effect transistor may further comprise a second top jumper overlying at least a third M1 track, wherein the first M2 track extends to and overlies the second top jumper. The first top jumper and the second top jumper may be of unequal lengths.

In another aspect, a method comprises: providing a substrate; forming a depression into the substrate; depositing a first metal into the depression and onto an upper surface of the substrate, such that the deposited first metal protrudes from the depression; patterning the deposited first metal; subtractively etching the first metal down to the upper surface of the substrate to form a first jumper in the depression and a first set of two or more first metallization tracks overlying the first jumper; depositing a dielectric material over the subtractively etched first metal; patterning the dielectric material; forming an opening in the dielectric material down to upper surfaces of the first set of two or more first metallization tracks; depositing a second metal in the opening in the dielectric material to form a second jumper in the opening, the second jumper extending across at least two of the two or more first metallization tracks; patterning the deposited second metal; and depositing a third metal onto the patterned deposited second metal to form a set of two or more second metallization tracks. At least one of the two or more second metallization tracks extends over a length of the second jumper.

The method may further comprise forming a device region on the substrate. Forming the opening in the dielectric material down to upper surfaces of the first set of two or more first metallization tracks may comprise using a reverse selective barrier process. Depositing the first metal into the depression and onto the upper surface of the substrate may comprise using a first damascene process. Depositing the second metal in the opening in the dielectric material to form the second jumper in the opening may comprise using a second damascene process. Depositing the third metal onto the patterned deposited second metal to form the set of two or more second metallization tracks may comprise using a third damascene process.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A semiconductor device, comprising:
   a first via level forming a bottom jumper configured to provide an output;
   a first set of two or more first metallization tracks overlying the first via level;
   a second via level forming a first top jumper overlying the first set of two or more first metallization tracks; and
   a second metallization track directly overlying the second via level, wherein the second metallization track extends over the first set of two or more first metallization tracks, covers an upper surface of the first top jumper, and is in direct contact with the upper surface of the first top jumper.

2. The semiconductor device of claim 1, wherein the first via level is of a length that is unequal to a length of the second via level.

3. The semiconductor device of claim 1, wherein the first set of two or more first metallization tracks comprises at least three or more first metallization tracks, and spacing between the at least three or more first metallization tracks is unequal.

4. The semiconductor device of claim 1, wherein the first set of first metallization tracks are formed by a subtractive process.

5. The semiconductor device of claim 1, wherein the first via level, the second via level, and the second metallization track are formed by a damascene process.

6. The semiconductor device of claim 1, wherein the second via level forms a second top jumper overlying a second set of first metallization tracks.

7. The semiconductor device of claim 6, wherein the second top jumper is of a length that is different from a length of the first top jumper.

8. The semiconductor device of claim 7, wherein the second top jumper overlies one metallization track of the second set of first metallization tracks.

9. A semiconductor structure comprising:
   a bottom jumper formed in a substrate;
   a first M1 track and a second M1 track each overlying the bottom jumper;
   a first top jumper overlying the first M1 track and the second M1 track; and
   a first M2 track directly overlying the first top jumper, wherein
   the first M2 track extends over the first M1 track and the second M1 track, covers an upper surface of the first top jumper, and is in direct contact with the upper surface of the first top jumper.

10. The semiconductor structure of claim 9, further comprising:
    a third M1 track overlying the bottom jumper, wherein the first M1 track, the second M1 track, and the third M1 track are unequally spaced.

11. The semiconductor structure of claim 9, further comprising:
    a second top jumper overlying at least a third set M1 track, wherein the first M2 track extends to and overlies the second top jumper.

12. The semiconductor structure of claim 11, wherein the first top jumper and the second top jumper are of unequal lengths.

\* \* \* \* \*